(12) United States Patent
Au et al.

(10) Patent No.: US 8,189,676 B2
(45) Date of Patent: May 29, 2012

(54) ADVANCE MACRO-BLOCK ENTROPY CODING FOR ADVANCED VIDEO STANDARDS

(75) Inventors: Oscar Chi Lim Au, Kowloon (HK); Chi Wah Wong, Shatin (HK)

(73) Assignee: Hong Kong University of Science & Technology, Hong Kong (CN)

( * ) Notice: Subject to any disclaimer, the term of this patent is extended or adjusted under 35 U.S.C. 154(b) by 1068 days.

(21) Appl. No.: 12/078,777

(22) Filed: Apr. 4, 2008

(65) Prior Publication Data

US 2008/0260041 A1 Oct. 23, 2008

Related U.S. Application Data

(60) Provisional application No. 60/907,517, filed on Apr. 5, 2007.

(51) Int. Cl.
*H04B 1/66* (2006.01)
*H04N 7/12* (2006.01)
*H04N 11/02* (2006.01)
*H04N 11/04* (2006.01)

(52) U.S. Cl. .................. 375/240.24; 386/206; 386/345

(58) Field of Classification Search ............... None
See application file for complete search history.

(56) References Cited

U.S. PATENT DOCUMENTS

| | | | |
|---|---|---|---|
| 5,298,896 A | 3/1994 | Lei et al. | |
| 5,717,816 A * | 2/1998 | Boyce et al. | 386/205 |
| 5,850,482 A | 12/1998 | Meany et al. | |
| 5,870,146 A * | 2/1999 | Zhu | 375/240.03 |
| 6,111,914 A | 8/2000 | Bist | |
| 6,118,822 A | 9/2000 | Bist | |
| 6,125,143 A * | 9/2000 | Suzuki et al. | 375/240.11 |
| 6,198,412 B1 | 3/2001 | Goyal | |
| 6,249,546 B1 | 6/2001 | Bist | |
| 6,298,160 B1 | 10/2001 | Goertzen | |
| 6,373,411 B1 | 4/2002 | Shoham | |
| 6,580,833 B2 | 6/2003 | Goertzen | |
| 6,614,442 B1 * | 9/2003 | Ouyang et al. | 345/545 |
| 6,633,242 B2 | 10/2003 | Brown | |
| 6,677,868 B2 | 1/2004 | Kerofsky et al. | |
| 6,778,708 B1 * | 8/2004 | Divakaran et al. | 382/236 |
| 6,842,483 B1 | 1/2005 | Au et al. | |
| 6,859,500 B2 | 2/2005 | Frojdh et al. | |
| 6,947,874 B2 | 9/2005 | Chen | |

(Continued)

OTHER PUBLICATIONS

Wong, et al. Advanced Macro-block Entropy Coding in H.264. IEEE International Conference on Acoustics, Speech and Signal Processing, (Apr. 15-20, 2007). I-1169-I-1172.

(Continued)

*Primary Examiner* — Ayaz Sheikh
*Assistant Examiner* — Peter Chau
(74) *Attorney, Agent, or Firm* — The Nath Law Group; Jerald L. Meyer; Stanley N. Protigal

(57) ABSTRACT

A method and a computer-readable medium containing computer program for encoding a frame of video data are presented. The frame of video data has a plurality of macro-blocks. Each of the macro-blocks includes a macro-block header having multiple elements and macro-block residue data. An element of the macro-block header is encoded based on the value of the same element of a previous macro-block header so as to reduce overall bits in the macro-block header. The element of the macro-block header is encoded by grouping the elements of the plurality of the macro-blocks.

14 Claims, 9 Drawing Sheets

U.S. PATENT DOCUMENTS

| | | | |
|---|---|---|---|
| 7,023,922 | B1 | 4/2006 | Xu et al. |
| 7,061,410 | B1 | 6/2006 | Pearson et al. |
| 7,158,684 | B2 | 1/2007 | Cheung et al. |
| 7,161,507 | B2 | 1/2007 | Tomic |
| 7,471,298 | B1* | 12/2008 | Noonburg ............... 345/531 |
| 2002/0136306 | A1* | 9/2002 | Frojdh et al. ............ 375/240.23 |
| 2003/0016755 | A1* | 1/2003 | Tahara et al. ............ 375/240.25 |
| 2003/0147561 | A1* | 8/2003 | Faibish et al. ................ 382/245 |
| 2003/0215011 | A1* | 11/2003 | Wang et al. ............ 375/240.03 |
| 2004/0196908 | A1* | 10/2004 | Lin et al. ................. 375/240.15 |
| 2006/0110059 | A1* | 5/2006 | Lin et al. ....................... 382/236 |
| 2007/0009026 | A1* | 1/2007 | Kwon et al. ............ 375/240.03 |
| 2009/0262835 | A1* | 10/2009 | Srinivasan et al. ....... 375/240.16 |

OTHER PUBLICATIONS

Yang, et al. Rate Control for Videophone Using Local Perceptual Cues. IEEE Transactions on Circuits and Systems for Video Technology. vol. 15, No. 4. Apr. 2005.

"GSM World News—Statistics" Retrieved from http://www.gsmworld.com/news/statistics/index.shtml, Retrieved and printed on May 26, 2008.

"Mobile Video Research & Statistics" Retrieved from http://mmaglobal.com/modules/wfsection/article.php?articleid=378, Retrieved and printed on May 26, 2008.

"Coding of Moving Pictures and Audio", ISO/IEC JTC1/SC29/WG11 N3312,Mar. 2000.

Moscheni et al. "Entropy criterion for optimal bit allocation between motion and prediction error information", Proc. SPIE Visual Commun. and Image Proc., pp. 235-242, Nov. 1993.

Yu, et al, "A Novel Model-based Rate-Control Method for Portrait Video Coding", IEEE Trans. Circuits Syst. Video Technol., vol. 15, No. 12, Dec. 2005.

Chinese Office Action, mailed on Jan. 24, 2011.

* cited by examiner

Graph of percentage of the number of bits of
MB Header of "Akiyo" in H.264 and H.263

Graph of percentage of the number of bits of
MB Header of "Foreman" in H.264 and H.263

| FH | MBR [1...N] | MBM [1...N] | MBVx [1...N] | MBVy [1...N] | MBC [1...N] | MBQ [1...N] | MBD [1...N] |

ADVANCE MACRO-BLOCK ENTROPY CODING FOR ADVANCED VIDEO STANDARDS

CLAIM OF PRIORITY

This application claims priority under 35 U.S.C. §119(e)(1) from U.S. Provisional Application No. 60/907,517 filed Apr. 5, 2007.

BACKGROUND OF THE INVENTION

The present subject matter relates generally to encoding a frame of video data, and more specifically to encoding the elements of macro-block header based on the values of the elements of the previous header.

Video coding achieves compression by eliminating redundancy in video data. There are two kinds of redundancies in video data: spatial and temporal redundancies. Removal of spatial redundancy and temporal redundancy involves looking within a frame through the use of transform coding techniques and between frames through the use of motion estimation and compensation techniques, respectively.

MPEG4 ("Coding of Moving Pictures and Audio," ISO/IEC JTC1/SC29/WG11 N3312, March 2000), H.263 ("H.263 Video Coding for Low Bit Rate Communication," ITU-T Recommendation, 1993), and H.264 ("T. Wiegand, "Working Draft Number 2, Revision 8 (WD-2 rev 8)," JVT-B118r8, ISO/IEC MPEG & ITU-T-T VCEG, Geneva, Switzerland, 29 Jan.-29 Feb. 2002) adopt block-based coding schemes, in which the pictures are divided into smaller units called blocks, which are to be processed one by one in raster-scan order by both the encoder and decoder. A block is defined as a set of 4×4 pixels in H.264, and 8×8 pixels in H.263 and MPEG4. A group of blocks with total size 16×16 is called a macro-block (MB). A number of consecutive MBs are grouped into slices, representing independent coding units to be decoded without referencing other slices of the same frame. Through DCT transformation and quantization, a set of data samples of the block is first linearly transformed and quantized into a set of transform coefficients, resulting in concentrating the energy of input samples into a small number of low-frequency coefficients. Variable length coding (VLC) is adopted for coding resulting residue data.

In low bit-rate video coding, larger quantization parameters are used to give a smaller number of bits spent on residue data. As a result, the header overhead is a dominant factor of yielding the overall bit rates, especially in high-complexity video standards such as H.264. In low bit-rate video coding, it is critical for low-speed network applications (K. Yu, J. Li, C. Shi, and S. Li, "A Novel Model-based Rate-Control Method for Portrait Video Coding," IEEE Trans. Circuits Syst. Video Technol., Vol. 15, No. 12, December 2005; X. Yang, W. Lin, Z. Lu, X. Lin, S. Rahardja, E. Ong, and S. Yao, "Rate Control for Videophone Using Local Perceptual Cues", IEEE Trans. Circuits Syst. Video Technol., Vol. 15, No. 4, April 2005) including 20-40 kbps 2.5 G wireless network, 24-64 kbps videophone and 64 kbps ISDN. Recently, watching video on a mobile phone become popular as a majority of mobile phones in the current market offer the capability of viewing mobile video. According to Mobile Video & Statistics in April 2006 ("Mobile Video Research & Statistics," http://mmaglobal.com/modules/wfsection/article.php?articleid=378), over a half of mobile users watched video on their own mobile phone at least once a week. In Korea, mobile TV was adopted on mobile phone recently. Other countries like the United States will make use of video streaming for mobile TV applications. In the near future, using video over mobile phones will become a common trend among mobile phone users. For those video applications, there is a need for an advanced coding scheme.

SUMMARY OF THE INVENTION

The present subject matter provides a method for encoding a frame of video data and a computer-readable medium containing a computer program that encodes a frame of video data.

An aspect of the subject matter includes a method for encoding a frame of video data, which comprises a plurality of macro-blocks (MBs), the MBs being divided into non-skipped MBs and skipped MBs, each of MBs including a MB header that has multiple elements and MB residue data, each of which includes a MB header having multiple elements and MB residue data, wherein an element of the MB header is encoded based on the value of the same element of a previous MB header so as to reduce overall bits in the MB header.

According to another aspect, the subject matter includes a method for encoding a frame of video data, which comprises a plurality of macro-blocks (MBs), the MBs being divided into non-skipped MBs and skipped MBs, each of MBs including a MB header that has multiple elements and MB residue data, one of the multiple elements being a MB run-length, the method comprising the steps of: determining whether i-th MB is a non-skipped MB within the frame; determining whether i is zero, if i-th MB is a non-skipped MB within the frame; encoding a current value of an element of the MB header as normal, if i is zero; and determining whether said current value of the element of the MB header is zero, if i is not zero.

According to a further aspect, the subject matter includes a computer-readable medium containing a computer program for encoding a frame of video data, which comprises a plurality of macro-blocks (MBs), the MBs being divided into non-skipped MBs and skipped MBs, each of MBs including a MB header that has multiple elements and MB residue data, one of the multiple elements being a MB run-length, the computer program comprising: first code for determining whether i-th MB is a non-skipped MB within the frame; second code for determining whether i is zero, if i-th MB is a non-skipped MB within the frame; third code for encoding a current value of an element of the MB header as normal, if i is zero; and fourth code for determining whether the current value of the element of the MB header is zero, if i is not zero.

BRIEF DESCRIPTION OF THE DRAWINGS

These and other aspects of the subject matter will be apparent with reference to the examples in the following description and with reference to the accompanying drawings, wherein.

DETAILED DESCRIPTION OF THE INVENTION

In this application, Applicants propose an advanced coding algorithm for entropy coding of a MB header, focusing inter-coded frames, i.e. P-frames, which may be used in, e.g. real-time video streaming applications. Applicants first investigate MB header features. It has been found that the proportion of the number of bits of a MB header to that of the combined MB residue data is relatively high (i.e. quantization parameter (QP) is large) in low bit-rate video coding and the header correlation of each individual elements, i.e. run-length, mode, motion vector, coded block pattern, and QP between neighboring MBs is high. Based on these MB header properties, Applicants take advantage of the most probable value of a MB header and propose an advanced coding algorithm for entropy coding of a MB header.

MB Header Overview

In H.264, each frame is divided into MBs of 16×16 luminance samples, with two corresponding 8×8 chrominance samples. In QCIF picture format, each frame comprises 99 MBs. A number of consecutive MBs in raster-scan order can be grouped into slices, representing independent coding units to be decoded without referencing other slices of the same frame.

Figure 1:
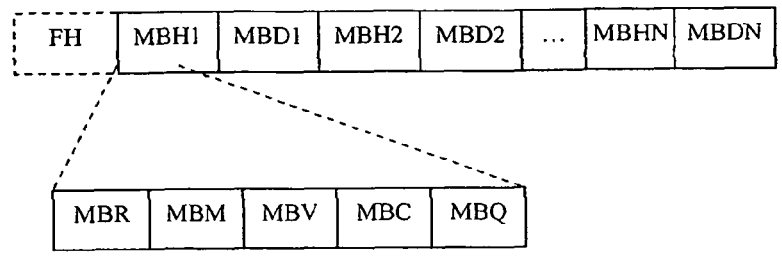
FIG. 1 shows basic H.264 MB syntax within a frame as slice.

Given that the whole frame is adopted as a unit slice, the frame header (FH) is encoded and N MBs are processed one by one. The resulting MB syntax is a MB header (MBH) followed by MB residue data (MBD) as shown in FIG. 1. In a P-frame, the MB header basically comprises elements such as run-length (MBR), MB mode (MBM), motion vector data (MBV), coded block pattern (MBC), and change of quantization parameter (MBQ). When the MB header starts to be encoded, the run-length indicates the number of skipped MBs that are made by copying the co-located picture information from the last decoded frame. With motion estimation, the best MB mode is determined and encoded by searching the best matches between the block made by the best mode and current block. To locate the reference inter-block made by the best mode, two-dimensional motion vectors are specified. The coded block pattern (CBP) indicates whether each of 8×8 luminance sub-blocks and 4×4 chrominance sub-blocks of a MB contains non-zero residue coefficients. With non-zero coefficients, MBQ determines the change of the quantization parameter of a current MB from the previous one. After the MB header is encoded, the non-zero luminance and chrominance coefficients are entropy-coded by either UVLC or CABAC ("T. Wiegand, "Working Draft Number 2, Revision 8 (WD-2 rev 8)," *JVT-B118r8, ISO/IEC MPEG & ITU-T-T VCEG*, Geneva, Switzerland, 29 Jan.-29 Feb. 2002). This encoding process repeats for next and remaining MBs of the frame.

MB Header Characteristic

Figure 2:
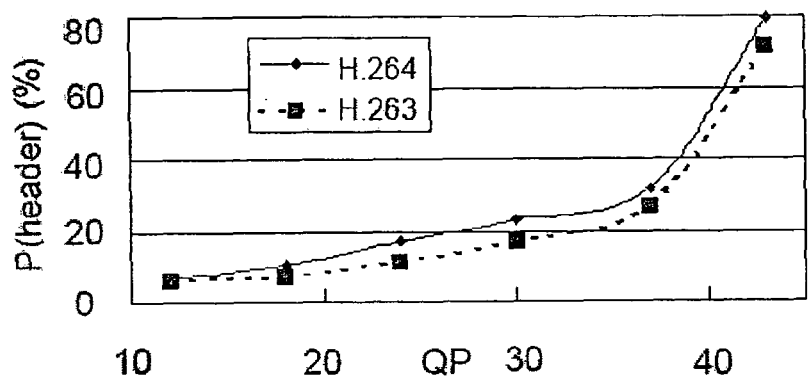
FIG. 2 shows a graph of percentage of the number of bits of MB header of "Akiyo" in H.264 and H.263.
Figure 3:
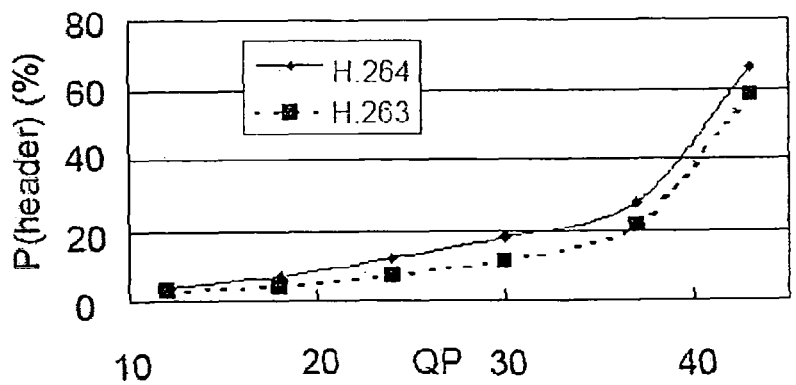
FIG. 3 shows a graph of percentage of the number of bits of MB header of "Foreman" in H.264 and H.263.
Figures 4, 5:
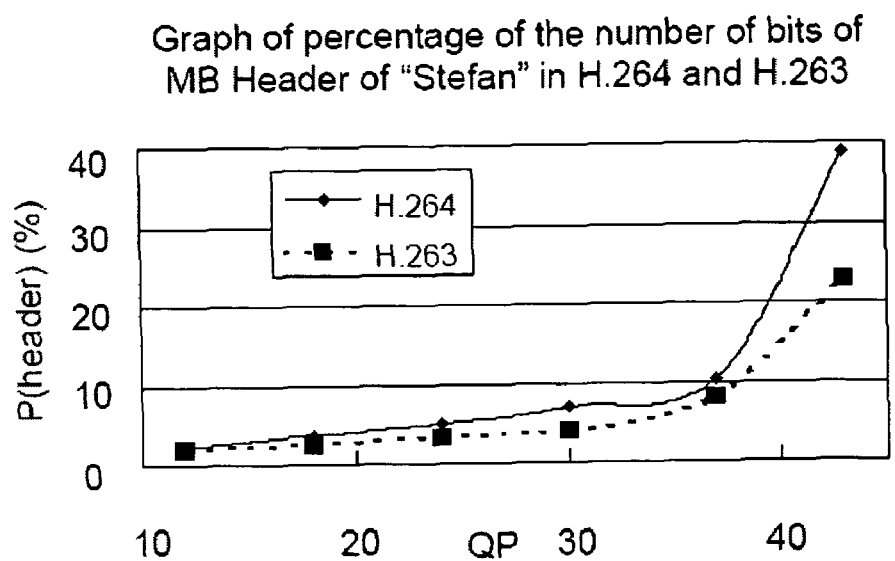
FIG. 4 shows a graph of percentage of the number of bits of MB header of "Stefan" in H.264 and H.263.
FIG. 5 shows H.264 MB syntax within a frame as slice.

1. Effect of Quantization Parameter:

Quantization parameter (QP) plays a role in video coding. The number of encoded bits is generally determined by QP. The greater the QP is, the smaller the overall bit rate is. The frame and MB header overhead are more complex in the latest video standard H.264 than in the previous standards such as H.263. The run-length and advanced MB mode are incorporated in the MB header of H.264, making its header size larger. Table 1 shows the percentage of the number of bits of MB header ($P_{header}$) and luminance & chrominance residue data ($P_{data}$) in H.264 and H.263. The corresponding graphs in video sequences "Akiyo," "Foreman," and "Stefan" are depicted in FIGS. 2, 3, and 4, respectively. The experimental conditions are basically similar in H.264 and H.263. The picture format is QCIF, the encoded frame rate is 10 frames per second (fps), the structure of Group of Pictures (GOP) is H.264 inter pictures (IPPP), maximum search range is 16, the number of reference frame is 1, and the entropy coding method is VideoLAN Client (VLC). It is noted that among the QP range [0 . . . 51], the QP values [12 . . . 43] in H.264 is similar to the QP' value [0 . . . 31] in H.263. Approximately, the QP=12, 37, and 43 in H.264 are nearly equal to the QP'=1, 16, and 32 in H.263, respectively. Every increment of 6 in the QP in H.264 (e.g. 37→43) doubles the QP' in H263 (e.g. 16→32). Other chosen QP values are also approximated accordingly.

TABLE 1

| Video Sequence | QP | H.264 $P_{header}$ (%) | H.264 $P_{data}$ (%) | H.263 $P_{header}$ (%) | H.263 $P_{data}$ (%) |
|---|---|---|---|---|---|
| Akiyo | 12 | 6.48 | 93.52 | 5.93 | 94.07 |
| | 18 | 10.34 | 89.66 | 7.01 | 92.99 |
| | 24 | 17.22 | 82.78 | 11.13 | 88.87 |
| | 30 | 23.12 | 76.88 | 16.56 | 83.44 |
| | 37 | 31.59 | 68.41 | 26.44 | 73.56 |
| | 43 | 79.45 | 20.55 | 67.74 | 32.26 |
| Foreman | 12 | 3.52 | 96.48 | 2.89 | 97.11 |
| | 18 | 7.01 | 92.99 | 3.55 | 96.45 |
| | 24 | 11.89 | 88.11 | 7.00 | 93.00 |
| | 30 | 18.13 | 81.87 | 81.87 | 88.93 |
| | 37 | 27.36 | 72.64 | 21.11 | 78.89 |
| | 43 | 66.32 | 33.68 | 51.20 | 48.80 |
| Stefan | 12 | 2.09 | 97.91 | 1.84 | 98.16 |
| | 18 | 3.78 | 96.22 | 2.3 | 97.7 |
| | 24 | 5.11 | 94.89 | 3.20 | 96.80 |
| | 30 | 7.02 | 92.98 | 4.03 | 95.97 |
| | 37 | 10.35 | 89.65 | 7.99 | 92.01 |
| | 43 | 38.88 | 61.12 | 22.75 | 77.25 |

It is observed that for any given QP, $P_{header}$ is higher in H.264 than H.263 mainly because more run-length and advanced MB mode are encoded in H.264, resulting in smaller bits of residue data relatively. It is also noticed that $P_{header}$ increases with the QP in both H.264 and H.263. When QP=43 in "Akiyo" and "Foreman," MB header is a dominant factor of yielding the overall number of encoded bits since most of the coefficients of the residue data are quantized to zero, giving insignificant bit contribution. In addition, higher run-length in a MB header is used for skipped MBs, giving larger run-length bits. In H.264, $P_{header}$ is even higher at larger QP values (i.e. >43) adopted in H.264. Therefore, a MB header is a critical factor of yielding the encoded bits in low bit-rate video coding, especially in larger QP range from H.264.

2. MB Header Correlation:

As described above, the MB header of each MB comprises its own elements, including MBR, MBM, MBV, MBC, and MBQ. Here, each MB header is encoded independently. There is MB header correlation between neighboring MBs. It is found that the most probable values of an element of neighboring MB headers are more likely repeated at larger QP and the most probable value of all the elements tends to be zero. Table 2 shows the percentage of getting the most probable value "zero" ($P_{zero}$) for the current element of a MB header given that the previous value is also the most probable value under the same experimental conditions as H.264 mentioned above.

TABLE 2

| Video Seq. | QP | MBR (%) | MBM (%) | MBV$_x$ (%) | MBV$_y$ (%) | MBC (%) | MBQ (%) |
|---|---|---|---|---|---|---|---|
| Akiyo | 12 | 80.6 | 74.2 | 10.6 | 13.2 | 0.0 | 100 |
|  | 18 | 70.1 | 79.1 | 13.1 | 16.8 | 2.2 | 100 |
|  | 24 | 61.0 | 81.3 | 16.7 | 19.3 | 5.8 | 100 |
|  | 30 | 52.5 | 84.6 | 18.1 | 22.1 | 10.9 | 100 |
|  | 37 | 43.5 | 87.4 | 21.6 | 26.8 | 16.8 | 100 |
|  | 43 | 35.5 | 98.8 | 41.0 | 55.1 | 27.8 | 100 |
| Foreman | 12 | 98.9 | 79.6 | 24.5 | 25.0 | 0.0 | 100 |
|  | 18 | 93.6 | 82.2 | 26.1 | 27.1 | 5.2 | 100 |
|  | 24 | 88.1 | 85.3 | 28.8 | 29.0 | 15.3 | 100 |
|  | 30 | 83.0 | 88.2 | 30.3 | 31.1 | 20.4 | 100 |
|  | 37 | 80.2 | 91.2 | 33.9 | 33.5 | 27.6 | 100 |
|  | 43 | 64.2 | 97.4 | 38.6 | 36.9 | 35.1 | 100 |
| Stefan | 12 | 98.8 | 81.3 | 25.1 | 14.2 | 0.0 | 100 |
|  | 18 | 96.1 | 84.4 | 25.9 | 15.3 | 7.3 | 100 |
|  | 24 | 94.2 | 87.0 | 26.5 | 16.8 | 18.1 | 100 |
|  | 30 | 93.3 | 90.3 | 27.1 | 18.4 | 25.9 | 100 |
|  | 37 | 92.2 | 92.3 | 27.8 | 20.3 | 31.1 | 100 |
|  | 43 | 78.6 | 96.4 | 35.1 | 29.3 | 36.5 | 100 |

In general, it is preferred to minimize both of the bits of MB header and MB residue data in accordance with the cost equations introduced in T. Wiegand, "Working Draft Number 2, Revision 8 (WD-2 rev 8)," *JVT-B*118*r*8, *ISO/IEC MPEG & ITU-T-T VCEG*, Geneva, Switzerland, 29 Jan.-29 Feb. 2002, and F. Moscheni et al., "Entropy Criterion for Optimal Bit Allocation between Motion and Prediction Error Information," *Proc. SPIE Visual Commun. And Image Proc.*, pp. 235-242, November 1993. It is noticed that $P_{zero}$ of all the elements, except MBR and MBQ, increases with QP. When QP=43, $P_{zero}$ ranges from 27.8 to 98.8%. MBM tends to give mode 0 for copying co-located reference MB with no MBV overhead bits. MBV$_x$ (horizontal direction) and MBV$_y$ (vertical direction) likely give zero components to minimize the overhead of motion vectors. MBC tends to contain "zero" CBP for indication of no luminance and chrominance coefficients to be encoded and no bits are spent on them. In case of MBR, non-zero run-length is preferred and more MBs are skipped to save bits at larger QP. Although $P_{zero}$ of MBR decreases with QP, the resulting value is still high (i.e. 35.5% in "akiyo"). Since the experiment uses the fixed QP, the value of MBQ remains constant regardless of QP values. So, the high MB header correlation indicates higher header redundancies to achieve better coding efficiency for compression, importantly in low bit-rate video coding (i.e. larger QP).

Proposed MB Header Grouping

As described above, MB header is a dominant factor of yielding the overall bits at larger QP and high MB header correlation can achieve higher coding efficiency. Instead of encoding individual MB header independently, an element of MB header should be encoded based on its previous values in order to reduce overall bits by grouping the same element of various MBs together. It is known that entropy (D. S. Taubman and M. W. Marcellin, JPEG2000 Image Compression Fundamentals, Standards and Practice, Norwell, *Kluwer Acad.*, 2002) of the current value H(Y) is larger than that of the current value H(Y|A) given the previous value is known.

$$H(Y) \geq H(Y|X) \quad (1)$$

Proof:

$$H(Y|X) = -\sum_{i=1}^{n}\sum_{j=1}^{n} p(x_i, y_j)\log_2(p(y_j|x_i))$$

$$= -\sum_{i=1}^{n}\sum_{j=1}^{n} p(x_i)p(y_j|x_i)\log_2(p(y_j|x_i))$$

$$= -\sum_{i=1}^{n} p(x_i)\sum_{j=1}^{n} p(y_j|x_i)\log_2(p(y_j|x_i))$$

$$= \sum_{i=1}^{n} p(x_i)H(Y|x_i)$$

$$\leq \sum_{i=1}^{n} p(x_i)H(Y)$$

$$= H(Y)\sum_{i=1}^{n} p(x_i)$$

$$= H(Y)$$

Similarly, if more previous values $X_1, X_2, \ldots$ and $X_k$ are known, the resulting entropy of the current value become smaller as given in the following equation:

$$H(Y) \geq H(Y|X_1) \geq H(Y|X_1,X_2) \ldots \geq H(Y|X_1,X_2\ldots X_k) \quad (2)$$

For the sake of illustration and simplicity, the element "MBR" is chosen at QP=37 in "Foreman" and two symbols, zero and non-zero values, are used. It is assumed that probabilities of previous zero and non-zero values are 0.7 and 0.3, respectively. Given the zero previous value, probabilities of current zero and non-zero values are 0.8 and 0.2, respectively. Given the non-zero previous value, probabilities of current zero and non-zero values are 0.6 and 0.4, respectively. Therefore, given the previous value, probabilities of current zero and non-zero values are 0.7×0.8+0.3×0.6=0.74 and 0.7×0.2+0.3×0.4=0.26, respectively. The entropy calculation is shown as follows:

$$H(Y) = -0.7 \log_2 0.7 - 0.3 \log_2 0.3$$
$$= 0.8813$$
$$H(Y|X) = -0.74 \log_2 0.74 - 0.26 \log_2 0.26$$
$$= 0.8268$$
$$< 0.8813$$

It is noticed that H(X)>H(X') since there is correlation between the previous and current values. The entropy of the next future value given the known previous value is even smaller (i.e. 0.8144). Therefore, it is preferable to encode the current and/or future value based on the previous value. FIG. 5 depicts the proposed H.264 MB syntax within a frame as slice.

In this proposed syntax, it is convenient for the video encoder to encode individual elements of MB header by placing the similar elements together among all the MBs within a frame. Instead of encoding a MB header followed by MB data of each MB one by one, the MB headers of all the MBs within a frame are placed and encoded first. After processing the MB headers, their remaining MB data is encoded.

Advanced MB Coding Algorithm

As described above, the most probable value of all the elements tends to be zero and the most probable values of an element of neighboring MB headers are more likely repeated at larger QP. By adopting run-length coding (D. S. Taubman and M. W. Marcellin, JPEG2000 Image Compression Fundamentals, Standards and Practice, Norwell, *Kluwer Acad.,* 2002), the proposed algorithm for encoding MB headers in a P-frame is shown in the following:

```
For each element of MB header
{
  Element_Run-length = 0
  For each i-th non-skipped MB within a frame
  {
    If (i=0)
      Encode curr_value as normal
    Else
    {
      If (curr_value = "zero")
      {
        If (prev_value = "zero")
        {
          Element_Run-length++
          If (i=last MB)
            Encode Element_Run-length
        }
        Else
          Encode curr_value as normal
      }
      Else
      {
        If (prev_value ="zero")
          (1)  Encode Element_Run-length
          (2)  Encode curr_value with index = curr_value−1
          (3)  Element_Run-length = 0
        Else
          Encode curr_value as normal
      }
    }
  }
  If (last MB = skipped MB and element = MBR)
    If (Element_Run-length > 0)
      (1)  Encode Element_Run-length
      (2)  Encode curr_value with index = curr_value−1
      Else
        Encode curr_value as normal
}
```

Figure 6:
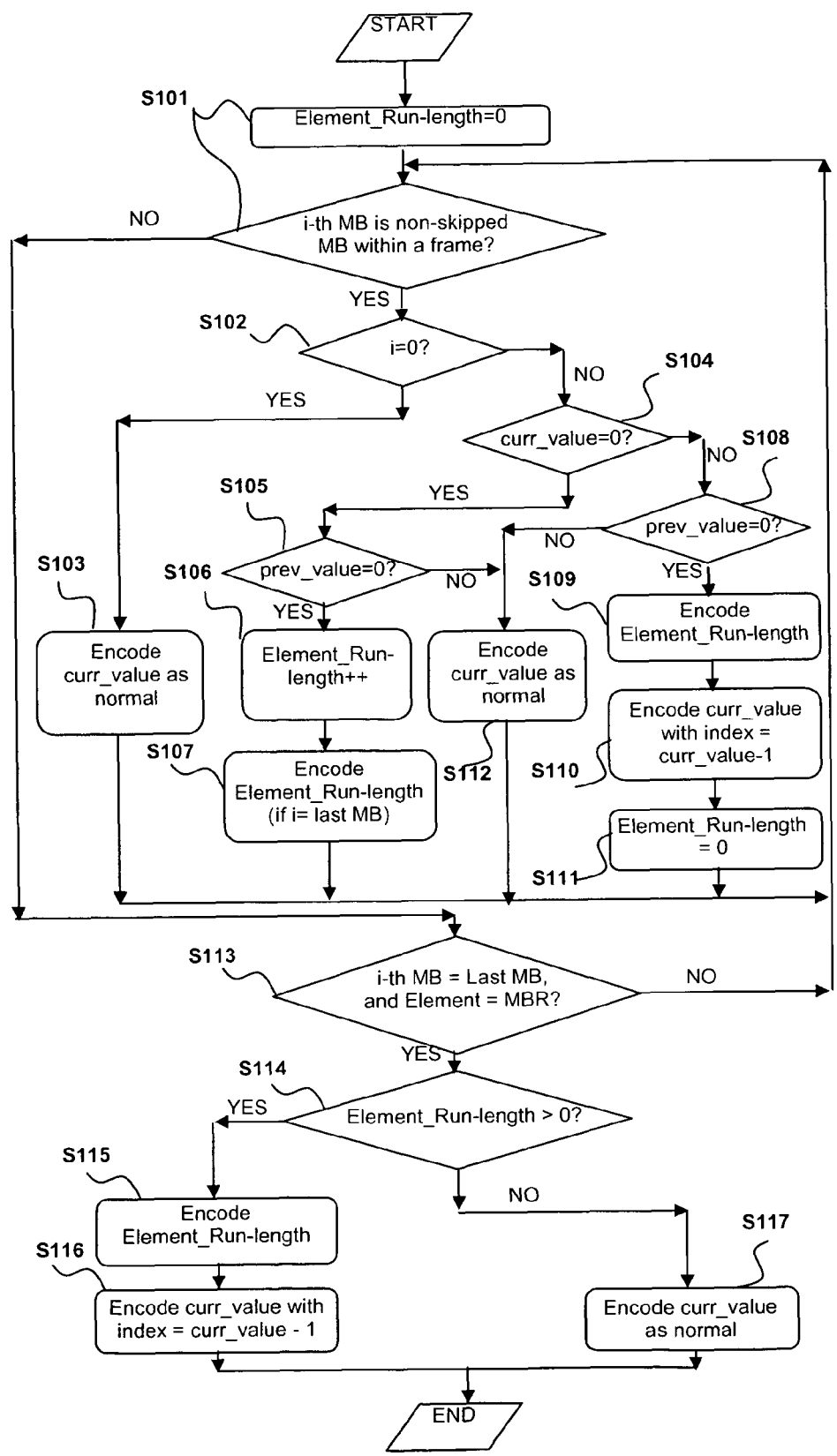
FIG. 6 is a flowchart showing an advanced algorithm for encoding a MB header in a P-frame according to an embodiment of the subject matter.
Figure 7:
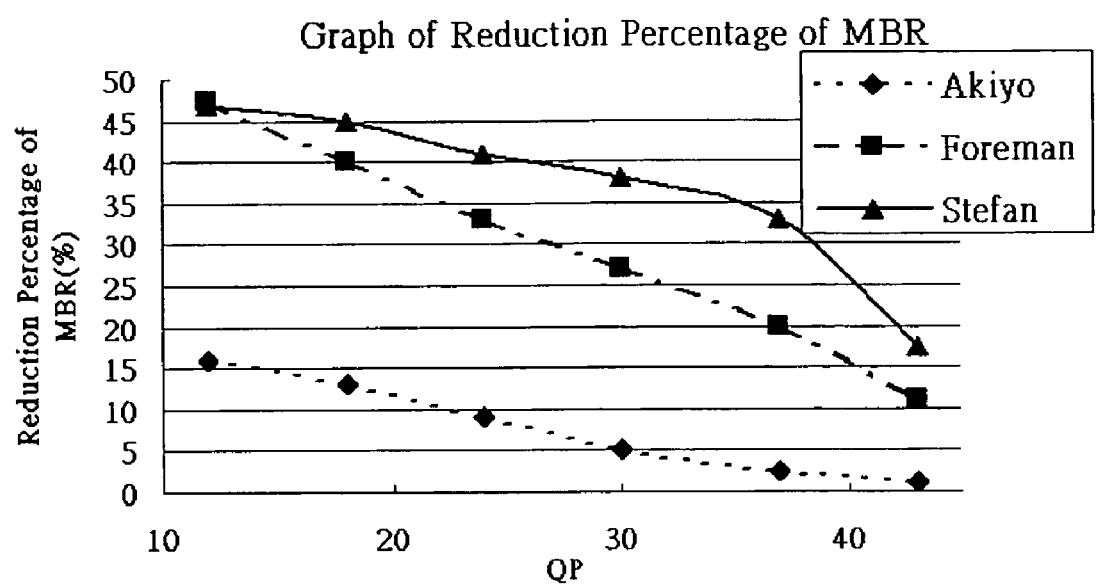
FIG. 7 shows a graph of reduction percentage of MBR.
Figure 8:
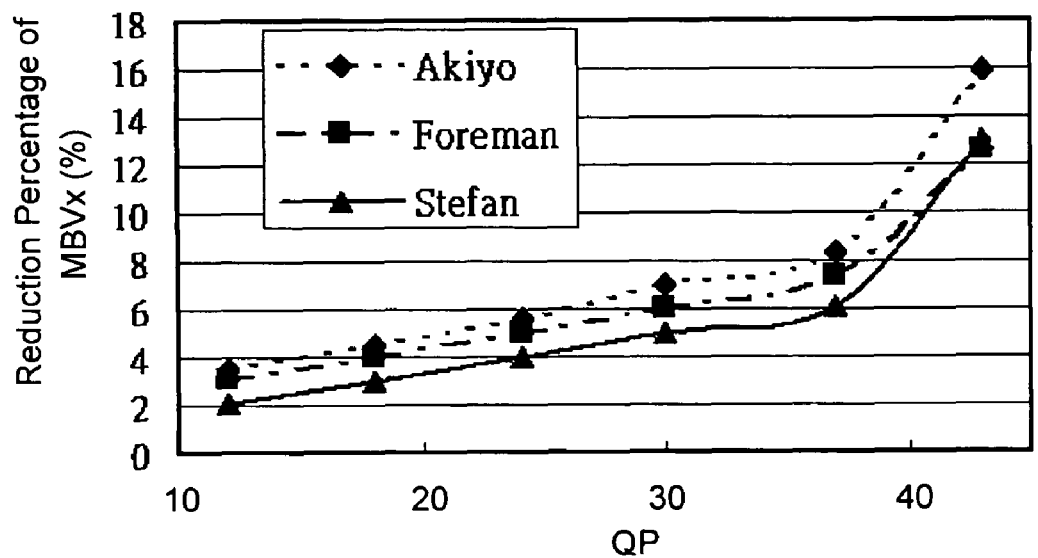
FIG. 8 shows a graph of reduction percentage of $MBV_x$.
Figure 9:
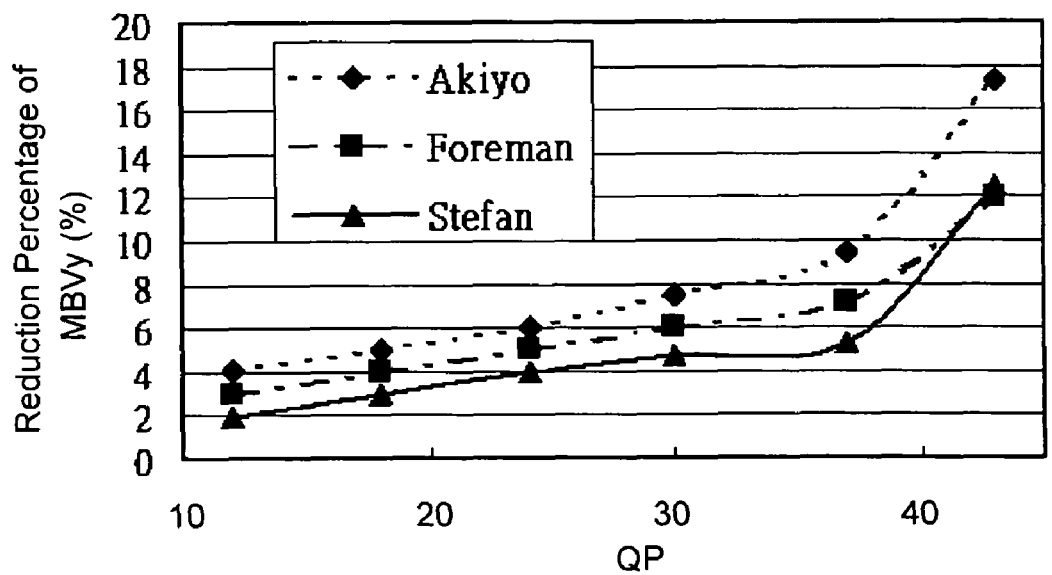
FIG. 9 shows a graph of reduction percentage of $MBV_y$.
Figure 10:
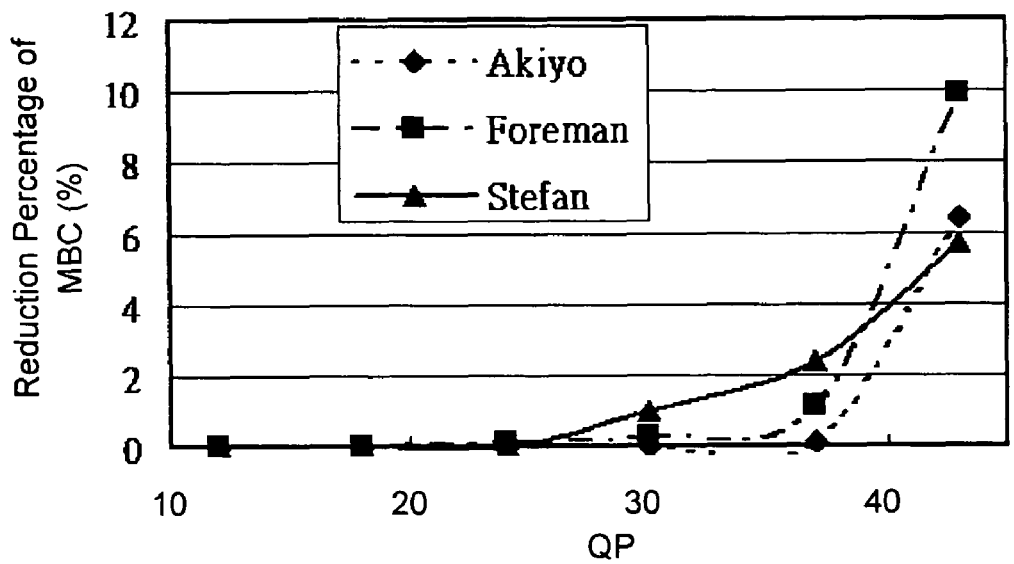
FIG. 10 shows a graph of reduction percentage of MBC.
Figure 11:
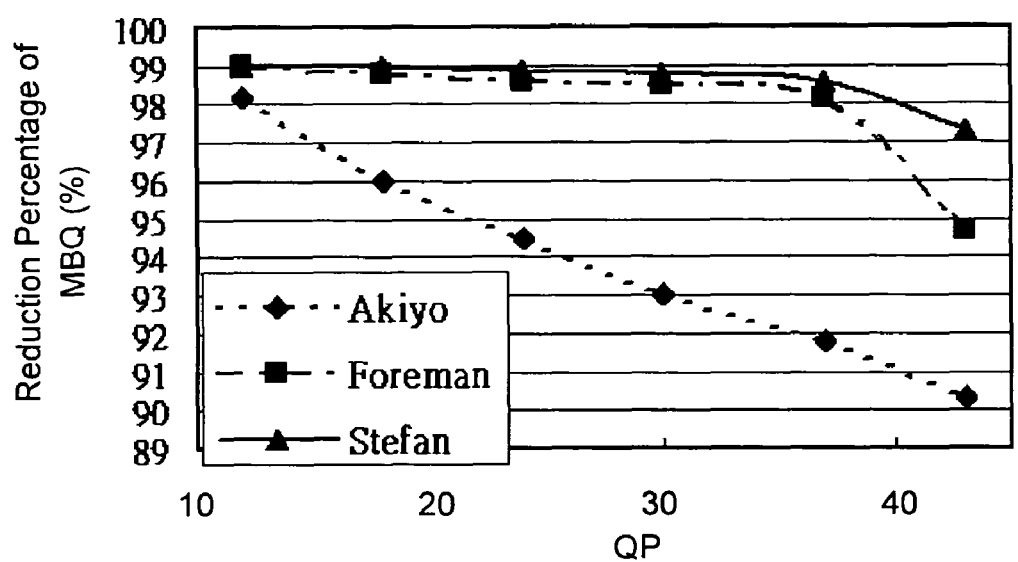
FIG. 11 shows a graph of reduction percentage of MBQ.
Figure 12:
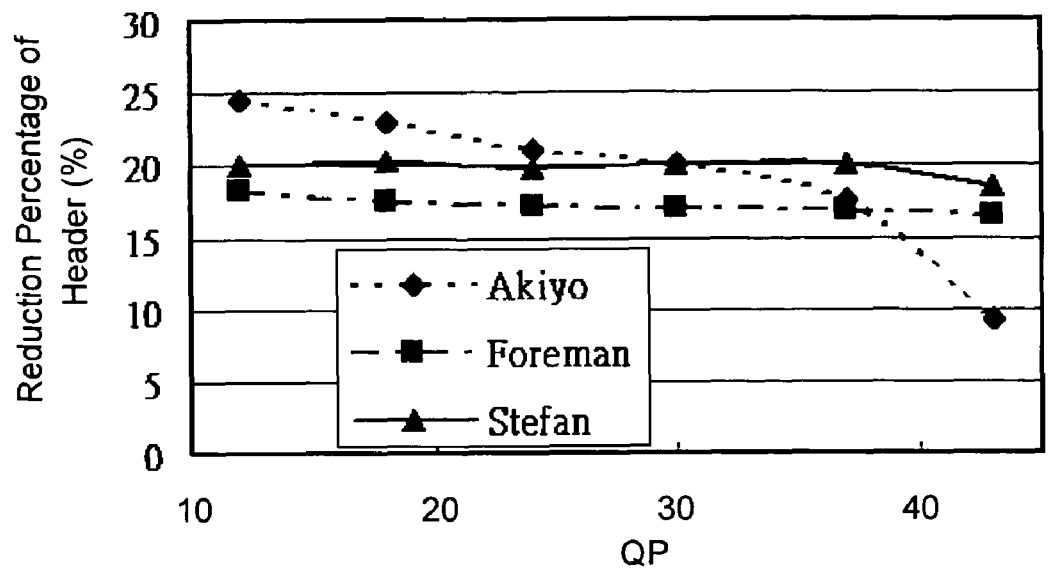
FIG. 12 shows a graph of reduction percentage of header.
Figure 13:
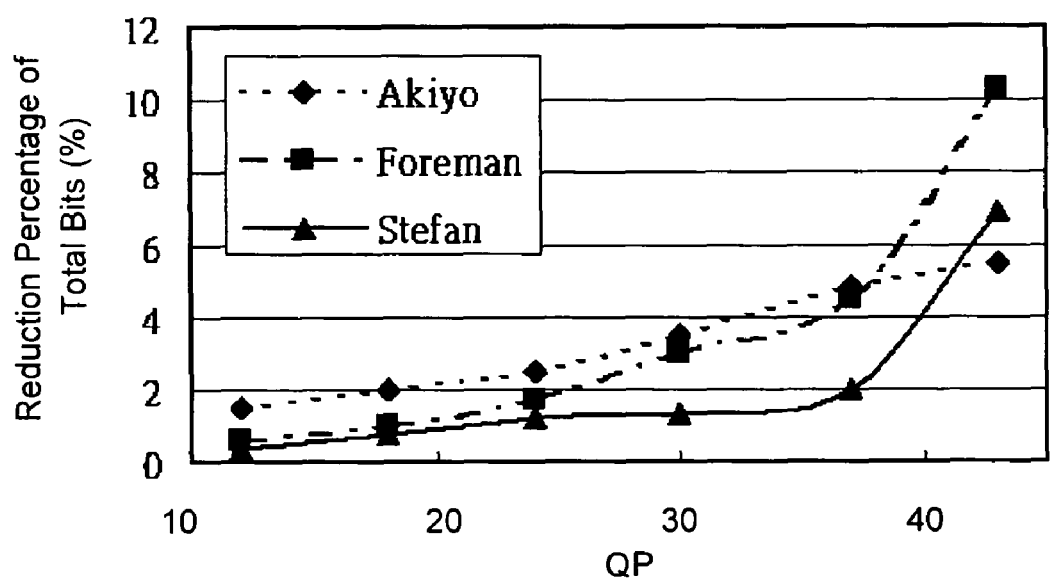
FIG. 13 shows a graph of reduction percentage of total bits.

According to the proposed MB syntax, the group of each element of a MB header, including MBR, MBM, $MBV_x$, $MBV_y$, MBC, and MBQ, is encoded one by one. FIG. 6 is a flowchart showing the implementation of the proposed algorithm indicated above.

First, the MB run-length is set to "zero" (S101). Then, it is determined whether i-th MB is a non-skipped MB within a frame (S101). If i-th MB is determined to be a non-skipped MB within a frame, then it is determined whether i is "zero," i.e. the first non-skipped MB, then the current value "curr_value" of the element is encoded as normal as original H.264 coding method (S102, S103). On the other hand, if i is not "zero" and the current value of the element is "zero" (S102, S104), the run-length is incremented by I (S106) when the previous value "prev_value" is also "zero" (S105). Here, if i-th MB is the last MB in the frame, the element run-length is encoded (S107) simultaneously with the run-length increment (S106). Otherwise, i.e. in case the previous value is not "zero," the "zero" current value is encoded as normal as H.264 (S112). In case of "non-zero" current value, the run-length is encoded when the previous value is "zero" (S104, S108). At the same time, the "non-zero" current value is encoded with codeword index equal to "curr_value-1" and the element run-length is set to "zero" (S110, S111). It is known that the current value is "non-zero" after "zero" previous value and its run-length are encoded (S109). The "zero" index can be excluded in the codeword table used in H.264. In the same codeword table, the non-zero current value can be encoded with one lower codeword index to achieve smaller encoded bits. If the current and previous values are "non-zero," the current value is encoded as normal as H.264 (S112). When the processed non-skipped MB is the last in a frame and the current and previous values are equal to "zero," the run-length is encoded (S107). After steps S103, S107, Sill, and S112 are completed, then the process moves on to step S101 again in order to determine whether i-th MB is a non-skipped MB within a frame.

In step S101, if i-th MB is determined to be a skipped MB within a frame, i.e. in case "NO," then it is determined whether i-th MB is a last MB and the element is a MB run-length (S113). When the last MB is the skipped MB, the run-length is encoded and "non-zero" current value is encoded with codeword index equal to "curr_value-1" for non-zero run-length (S113, S114, S115, S116). On the other hand, in case either i-th MB is not a last MB or the element is not a MB run-length, the process is subject to step S101 again (S113). For zero run-length, the current value is encoded as normal (S117). The codeword of the element run-length is proposed in Table 3.

TABLE 3

| Run-length | Codeword | No. of Bits |
|---|---|---|
| 0 | 1 | 1 |
| 1 | 010 | 3 |
| 2 | 011 | 3 |
| 3 | 0010 | 4 |
| 4 | 0011 | 4 |
| 5 | 00010 | 5 |
| 6 | 00011 | 5 |
| ... | | |

For run-length value K, the codeword is either "0 . . . 01X" where X=0 for odd K or X=1 for even K. The corresponding number of bits is [K/2]+2 for K>0. In QCIF picture format, the maximum run-length is 98, giving the codeword "0 . . . 011" and 51 codeword bits. In a decoder side, the codeword is decoded to the current value as normal as H.264 when the previous value is non-zero or the MB is the first non-skipped one during decoding groups of each element. Otherwise, the run-length and the next codeword, with one lower codeword index, are decoded within a frame. The following MBs are decoded in the same way until the last MB. This process repeats for next and following frames.

Experimental Results

Applicants implemented the proposed algorithm in a JVT JM 10.2 version ("JVT JM10.2," http://iphome.hhi.de/suchring/tml/, 2006). In the following experiments, the proposed algorithm is compared with the original H.264 JM10.2 encoder. The test conditions used in the baseline profile are as follows: The picture format is QCIF, the encoded frame rate is 10 fps, maximum search range is 16, the number of reference frame is 1, and the entropy coding method is UVLC, MV resolution is ¼ pet, Hadamard is "OFF," RD optimization is "OFF," and restrict search range is "0." The first frame was intra-coded (I-frame) and other remaining frames are inter-coded (P-frame).

TABLE 4

| Video Seq. | QP | MBR Bits | MBR $P_r$ (%) | MBM Bits | MBM $P_r$ (%) | $MBV_x$ Bits | $MBV_x$ $P_r$ (%) | $MBV_y$ Bits | $MBV_y$ $P_r$ (%) | MBC Bits | MBC $P_r$ (%) | MBQ Bits | MBQ $P_r$ (%) | Header Bits | Header $P_r$ (%) | Total Bits Bits | Total Bits $P_r$ (%) |
|---|---|---|---|---|---|---|---|---|---|---|---|---|---|---|---|---|---|
| Akiyo | 12 | 9k | 16.0 | 3k | 43.6 | 5k | 3.5 | 5k | 4.1 | 37k | 0.0 | 5k | 47.0 | 54k | 24.5 | 1154k | 1.5 |
|  | 37 | 6k | 2.4 | 1k | 45.3 | 2k | 8.3 | 2k | 9.4 | 8k | 0.1 | 3k | 45.1 | 20k | 17.5 | 76k | 4.8 |
|  | 43 | 3k | 1.2 | 1k | 47.6 | 1k | 15.9 | 1k | 17.3 | 1k | 6.4 | 1k | 35.2 | 6k | 9.2 | 12k | 5.5 |
| Foreman | 12 | 5k | 47.3 | 2k | 45.9 | 35k | 3.1 | 35k | 3.0 | 77k | 0.0 | 5k | 47.0 | 157k | 18.2 | 5393k | 0.6 |
|  | 37 | 8k | 20.0 | 1k | 46.3 | 28k | 7.3 | 28k | 7.1 | 38k | 1.1 | 3k | 45.4 | 105k | 16.8 | 441k | 4.5 |
|  | 43 | 8k | 11.1 | 1k | 47.3 | 16k | 12.6 | 17k | 11.9 | 11k | 9.9 | 2k | 42.6 | 56k | 16.4 | 91k | 10.3 |
| Stefan | 12 | 5k | 47.0 | 2k | 44.1 | 36k | 2.1 | 35k | 1.9 | 73k | 0.0 | 5k | 47.0 | 155k | 20.1 | 9110k | 0.4 |
|  | 37 | 7k | 33.0 | 1k | 46.7 | 24k | 6.1 | 23k | 5.3 | 54k | 2.4 | 4k | 46.3 | 121k | 20.0 | 1422k | 2.0 |
|  | 43 | 8k | 17.4 | 1k | 48.4 | 19k | 13.0 | 20k | 12.5 | 26k | 5.7 | 3k | 45.7 | 76k | 18.5 | 225k | 6.9 |

Figure 14:
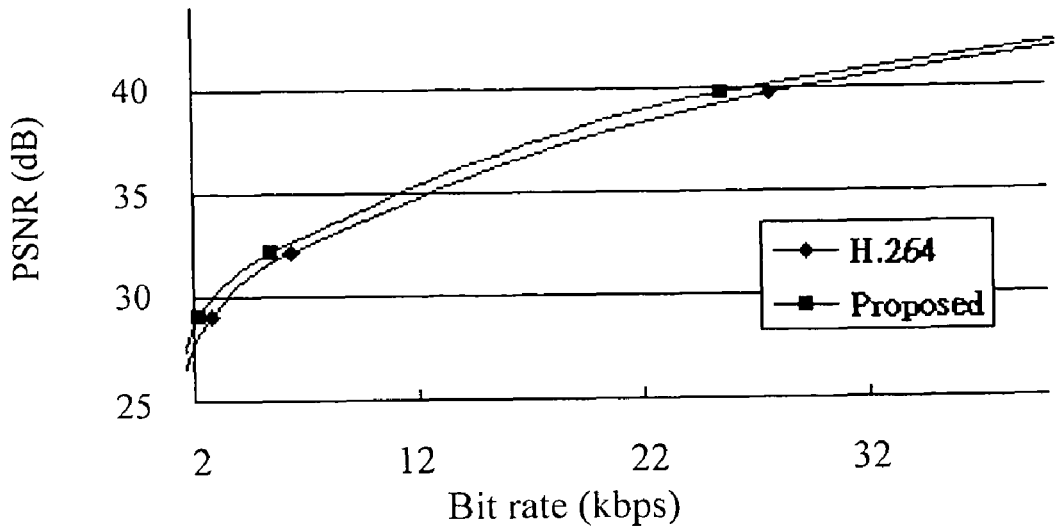
FIG. 14 shows a graph of PSNR against bit rate in "Akiyo.
Figure 15:
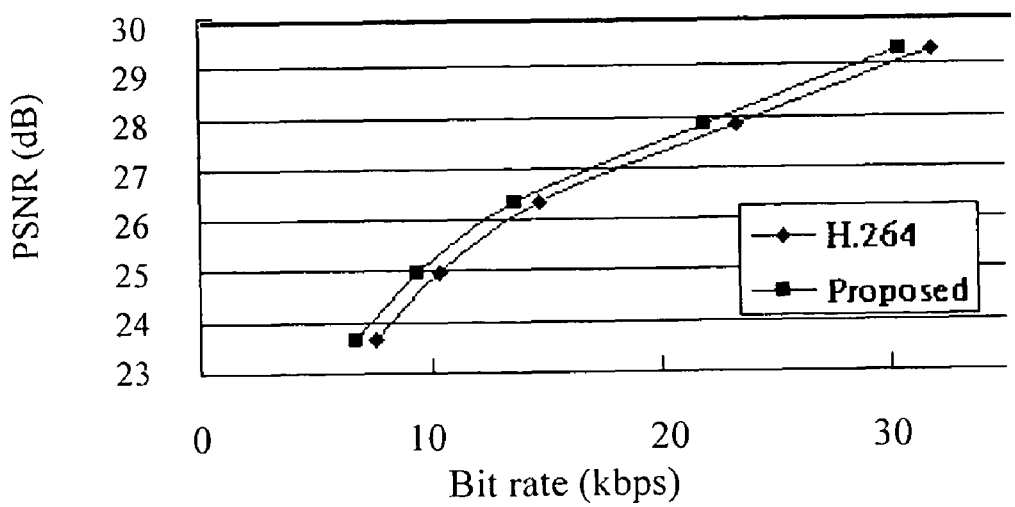
"
FIG. 15 shows a graph of PSNR against bit rate in "Foreman.
Figure 16:
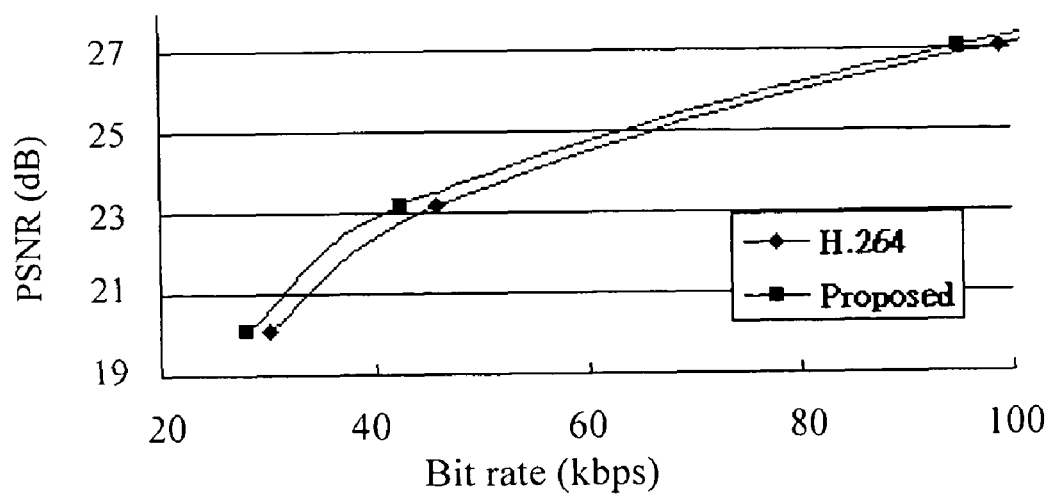
"
FIG. 16 shows a graph of PSNR against bit rate in "Stefan."

Table 4 shows the encoded bits and reduction percentage $P_r$ of each element for P-frame in the proposed algorithm, compared with original H.264 MB header coding algorithm. FIGS. 7-13 show the corresponding reduction percentage with QP in video sequences "Akiyo," "Foreman," and "Stefan." $P_r$ is defined as $(R_{old}-R_{new})/R_{old}*100$ where $R_{old}$ and $R_{new}$ are the number of bits of the original H.264 and the proposed algorithms, respectively. Two algorithms give the same Peak Signal-to-Noise Ratio (PSNR) but different encoded bits as their MB header entropy coding methods are different. It is observed that the smaller number of header bits and total bits can be obtained in the proposed algorithm. $P_r$ of the header bits is about 20%, ranging from 9.2 to 24.5%. It can be seen that $P_r$ of the header bits is not so high when QP=43 possibly due to low $P_r$ of MBR and MBQ. $P_r$ of MBR is low possibly because the number of skipped MBs varies over MBs, resulting in low number of zero run-length of skipped MBs. $P_r$ of MBQ is low possible because the number of non-skipped MBs is low and the encoded bits of MBQ is not high, resulting in relatively low bit reduction in the proposed scheme. $P_r$ of the total bits is up to 10.3% in "Foreman" when QP=43. It can be seen that the proposed algorithm has an obvious bit reduction improvement in low bit-rate video coding (i.e. larger QP) because MB header overhead is dominant and compressed effectively. It is noticed that $P_r$ of each element has similar behavior to its $P_{zero}$ depicted in Table 2. In case of MBM, MBV, and MBC, $P_r$ and $P_{zero}$ increase with QP. It is observed that $P_r$ is zero in case of MBC when QP=12 since non-zero (instead of zero) coefficients are preferred and encoded as normal. In case of MBR, $P_r$ and $P_{zero}$ decrease with QP. In case of MBQ, $P_r$ is about 50% as the bit reduction in our proposed codeword, i.e. [K/2]+2, is nearly 50% for fixed QP. It is also observed that $P_r$ decreases slightly with QP as the number of non-skipped MBs becomes smaller, resulting in insignificant effect of bit reduction relatively. The same experiments are also done in H.263, giving the similar results but slightly lower P. FIG. 14 to FIG. 16 show the graph of PSNR against bit rate in video sequence "Akiyo," "Foreman," and "Stefan" at low bit rates. In any video sequence, there is PSNR gain at any given bit rate. At 10 kbps in "Foreman," PSNR gain of the proposed algorithm is about 0.3-0.4 dB over JM10.2.

The header information normally has higher priority over data information since the use of data information mainly depends on the header. Data information is not identified in case of header corruption. In the proposed syntax, the header and data information are treated separately such that different protection methods can be adopted easily. For example, more robust channel coding can be used for coding header information.

In addition, the video decoder is more efficient when this proposed syntax is used because the ineffective decision operation, e.g. if-then-else operation, existing mainly in MB header, is separated. The decision operations are processed in real-time and then the remaining MB data can be decoded effectively nearly without decision operation. Also, values, e.g. function parameters, in low-level cache memory can be re-used in both separated header and data parts since the coding process is repeated one MB by one MB within a group of element of MB header and/or separated data.

It is also observed that no time delay is made at the decoding side as the whole frame is displayed only when all the MBs in the frame, i.e. slice, are decoded completely. In other words, the decoding time to display each frame is the same regardless of the syntax of the frame slice.

The subject matter being thus described, it will be obvious that the same may be varied in many ways. Such variations are not to be regarded as a departure from the spirit and scope of the subject matter, and all such modifications as would be obvious to one skilled in the art are intended to be included within the scope of the following claims.

What is claimed is:

1. A method for encoding a frame of video data, which comprises a plurality of macro-blocks (MBs), each of which includes a MB header having multiple elements and MB residue data, comprising:
    encoding an element of the MB header, said encoding based on a value of the same element of a previous MB header so as to reduce overall bits in the MB header, the method further comprising:
    determining whether i-th MB is a non-skipped MB within the frame;
    determining whether i is zero, if i-th MB is a non-skipped MB within the frame;
    encoding a current value of an element of the MB header as normal according to a standardized entropy encoding scheme, if i is zero;
    determining whether said current value of the element of the MB header is zero, if i is not zero; and
    determining whether a previous value of the element is zero, if the current value of the element of the MB header is zero and i is not zero.

2. The method of claim 1, wherein the element of the MB header is encoded by grouping the elements of the plurality of the MBs.

3. A method for encoding a frame of video data, which comprises a plurality of macro-blocks (MBs), the MBs being divided into non-skipped MBs and skipped MBs, each MB including a MB header that has multiple elements and MB residue data, one of the multiple elements being a MB run-length, the method comprising the steps of:

determining whether i-th MB is a non-skipped MB within the frame;

determining whether i is zero, if i-th MB is a non-skipped MB within the frame;

encoding a current value of an element of the MB header as normal according to a standardized entropy encoding scheme, if i is zero;

determining whether said current value of the element of the MB header is zero, if i is not zero; and determining whether a previous value of the element is zero, if the current value of the element of the MB header is zero and i is not zero.

4. The method of claim 3, wherein the method further comprises the steps of:

incrementing the MB run-length by one, if the previous value of the element is zero; and encoding the current value of the element as normal according to a standardized entropy encoding scheme, if the previous value of the element is not zero.

5. The method of claim 4, wherein the method further comprises the step of:

encoding the MB run-length, if i is not zero, the current value is not zero, and the previous value is zero.

6. The method of claim 3, wherein the method further comprises the step of:

determining whether a previous value of the element is zero, if neither the current value nor i is zero.

7. The method of claim 6, wherein, if the current value is not zero and the previous value is zero, the method further comprises the steps of:

encoding the MB run-length; and encoding the current value of the element with index=(the current value−1).

8. The method of claim 6, wherein the method further comprises the step of:

encoding the current value as normal according to a standardized entropy encoding scheme, if neither the previous value nor the current value is zero.

9. The method of claim 3, wherein the method further comprises the step of:

determining whether i-th MB is a last MB, if i-th MB is not a non-skipped MB within the frame.

10. The method of claim 9, wherein the method further comprises the step of:

determining whether the MB run-length is greater than zero, if i-th MB is a last MB.

11. The method of claim 10, wherein the method further comprises the steps of:

encoding the MB run-length and a current value of the element with index=(current value−1), if the MB run-length is greater than zero; and encoding the current value of the element as normal according to a standardized entropy encoding scheme, if the MB run-length is not greater than zero.

12. The method of claim 9, wherein the method further comprises the step of:

determining again whether i-MB is a non-skipped MB within the frame, if i-th MB is not the last MB.

13. The method of claim 3, wherein the method further comprises the step of:

determining again whether i-MB is a non-skipped MB within the frame, if encoding the current value of the element of the MB header as normal according to a standardized entropy encoding scheme has been completed.

14. A non-transitory computer-readable medium containing a computer program for encoding a frame of video data, which comprises a plurality of macro-blocks (MBs), the MBs being divided into non-skipped MBs and skipped MBs, each MB including a MB header that has multiple elements and MB residue data, one of the multiple elements being a MB run-length, said computer program comprising:

first code for determining whether i-th MB is a non-skipped MB within the frame;

second code for determining whether i is zero, if i-th MB is a non-skipped MB within the frame;

third code for encoding a current value of an element of the MB header as normal according to a standardized entropy encoding scheme, if i is zero;

fourth code for determining whether the current value of the element of the MB header is zero, if i is not zero; and fifth code for determining whether a previous value of the element is zero, if the current value of the element of the MB header is zero and i is not zero.

* * * * *